US007852590B1

(12) United States Patent
Olliges

(10) Patent No.: US 7,852,590 B1
(45) Date of Patent: Dec. 14, 2010

(54) SOLID STATE MEMORY DECOMMISSIONER

(76) Inventor: William E. Olliges, 5027 SW. Moore St., Palm City, FL (US) 34990

( * ) Notice: Subject to any disclaimer, the term of this patent is extended or adjusted under 35 U.S.C. 154(b) by 6 days.

(21) Appl. No.: 12/506,870

(22) Filed: Jul. 21, 2009

(51) Int. Cl.
*G11B 5/03* (2006.01)
*H03K 19/00* (2006.01)
*G11C 16/04* (2006.01)

(52) U.S. Cl. ......................... 360/66; 326/8; 365/185.04

(58) Field of Classification Search ............. 365/189.05
See application file for complete search history.

(56) References Cited

U.S. PATENT DOCUMENTS 4,873,408 A * 10/1989 Smith et al. ................. 219/716
5,642,268 A * 6/1997 Pratt et al. .................... 363/17
7,099,110 B2 8/2006 Detzler
7,180,777 B2 2/2007 Salessi et al.
2008/0219122 A1 9/2008 Detzler et al.
2008/0250948 A1 10/2008 Aoki et al.

* cited by examiner

*Primary Examiner*—Vibol Tan
*Assistant Examiner*—Dylan White
(74) *Attorney, Agent, or Firm*—McHale & Slavin, P.A.

(57) ABSTRACT

The present invention relates to an apparatus and method for easily, quickly and permanently decommissioning an electronic data storage device by thoroughly exposing the device to a strong field of microwave energy thereby eliminating any possibility of retrieving data from the device. The magnetron is operated as peak power and pulsed for the time needed to assure data destruction.

17 Claims, 3 Drawing Sheets

SOLID STATE MEMORY DECOMMISSIONER

FIELD OF THE INVENTION

The present invention relates to data security and protection of sensitive and/or confidential information and in particular to an apparatus and method for destructively purging data from an electronic memory device.

BACKGROUND OF THE INVENTION

The use of solid state electronic memory devices has become pervasive. These devices are small, relatively inexpensive and can be easily used to write and rewrite large amounts of data, information, etc. These devices have proven themselves to be relatively stable and secure. A USB flash drive consists of a NAND-type flash memory storage device that is configured with a USB (universal serial bus) interface. Storage capacities range from 64 MB to 128 GB and quite possibly more capacity in the future. Some flash drives will allow up to one million write or erase cycles and have a ten year data retention. The memory storage is based on earlier EPROM and EEPROM technologies. A USB flash drive consists basically of four components: a male type USB connector, a USB mass storage controller, a NAND flash memory chip and a crystal oscillator that provides a clock signal and controls the device's data output. Flash drives and smart cards are resistant to mechanical or magnetic damage, dust and have a high structural integrity making them ideal for transportation data from one location to the next while keeping it readily available for use. One drawback to their small size is the risk of loss or misplacement. Quite often these solid state electronic memory devices are used to hold sensitive and/or confidential information. When these devices are employed to contain sensitive information such as military data, trade secrets, secrets of state, and personal information additional steps must be taken to ensure permanent and quick destruction of the data that they contain.

Several devices for destruction of magnetic and optical computer media containing confidential or secret information have existed for some time. Currently several new developments in computer storage media, including USB drives such as "thumb drives", flash memory cards, and solid state hard drives have emerged. The subject of this application is a secure destruction device for solid state memories and other solid state electronics such as PCB assemblies, cell phones, PDIs and other electronic devices that are capable of containing confidential or secret information.

Personal computing devices, be they notebooks, net books, desk tops, smart phones, digital cameras etc., are all configured to utilize some form of solid state electronic storage media. Under some circumstances the electronic erasure of data fails to provide the necessary assurance that the information is beyond retrieval from the memory circuits. The effectiveness of some data eraser software is somewhat questionable. In addition, the use of software erasure programs can be problematic and time consuming. Further, the eraser software must be manually started and the program will need to run in order to perform the data erasure. It is therefore imperative that the memory circuits are positively interrupted such that data is irretrievable.

DESCRIPTION OF THE PRIOR ART

Prior attempts have been made to permanently erase or destroy electronic data devices. U.S. Pat. No. 7,099,110, to Detzler discloses a system and method for permanently and generally instantaneously destroying at the data contained on magnetic data storage media. The unauthorized attempt to access the data stored on magnetic media is prevented by destruction of the media with a reactant chemical. This approach may be initiated as a response to tampering or intentionally by using any one of several triggering interfaces. Destruction of the media is quick and permanent, rendering the data unrecoverable even to aggressive recovery procedures.

U.S. Pat. No. 7,180,777, to Salessi et al is directed to a memory purge system that destructively purges the memory circuits of a memory device. The system includes a power supply for supplying a selectable voltage and current. Switching circuits electrically connect the power supply to the memory circuits of the memory device. A controller selects a voltage and current supplied by the power supply and activates the switching circuit to apply the voltage and current to the memory circuits. The controller determines whether the memory circuits have been destroyed by monitoring current flow into the memory circuits.

U.S. Published Patent Application 2008/0250948, to Aoki et al discloses a hard disk destruction apparatus. The apparatus has a penetrating point that is manually pressed against a hard disk. The point has an angled tip designed to penetrate the hard disk casing and deform the hard disk platters with the casing. It has a manual actuator that avoids the use of any electrical power or fuel. In one disclosed embodiment a mechanical arbor press provides the necessary force.

U.S. Published Patent Application 2008/0219122, to Detzler et al discloses a system and method for destroying at least the data contained on a data storage media, such as a hard drive or flash drive, upon the occurrence of certain events. The media is destroyed by the release and application of a reactant chemical.

Therefore, what is needed is an apparatus and method for quickly and easily decommissioning an electronic data storage device without the need for software or destruction of the device by using chemicals or impact tools to ensure physical destruction.

SUMMARY OF THE INVENTION

When a digital memory storage device is used to store sensitive or confidential information it will, at some point in time, be necessary to assure destruction of all data to prevent access to the sensitive information.

Accordingly, it is an objective of the instant invention is to provide an apparatus and method to effectively decommission an electronic storage device.

It is a further objective of the instant invention to provide a method and apparatus to effectively and quickly purge the data on an electronic media device.

It is yet another objective of the instant invention to use non-coherent microwaves to open linking traces between cells and disrupt the individual gate oxide of the data cells and controller cells of the electronic media storage device.

It is a still further objective of the invention to provide an apparatus and method for quickly and easily decommissioning an electronic data storage device without the need for software or destruction of the device by using chemicals or specialized equipment to ensure physical destruction.

Other objectives and advantages of this invention will become apparent from the following description taken in conjunction with any accompanying drawings wherein are set forth, by way of illustration and example, certain embodiments of this invention. Any drawings contained herein constitute a part of this specification and include exemplary embodiments of the present invention and illustrate various objects and features thereof.

DETAILED DESCRIPTION OF THE INVENTION

Figure 1:
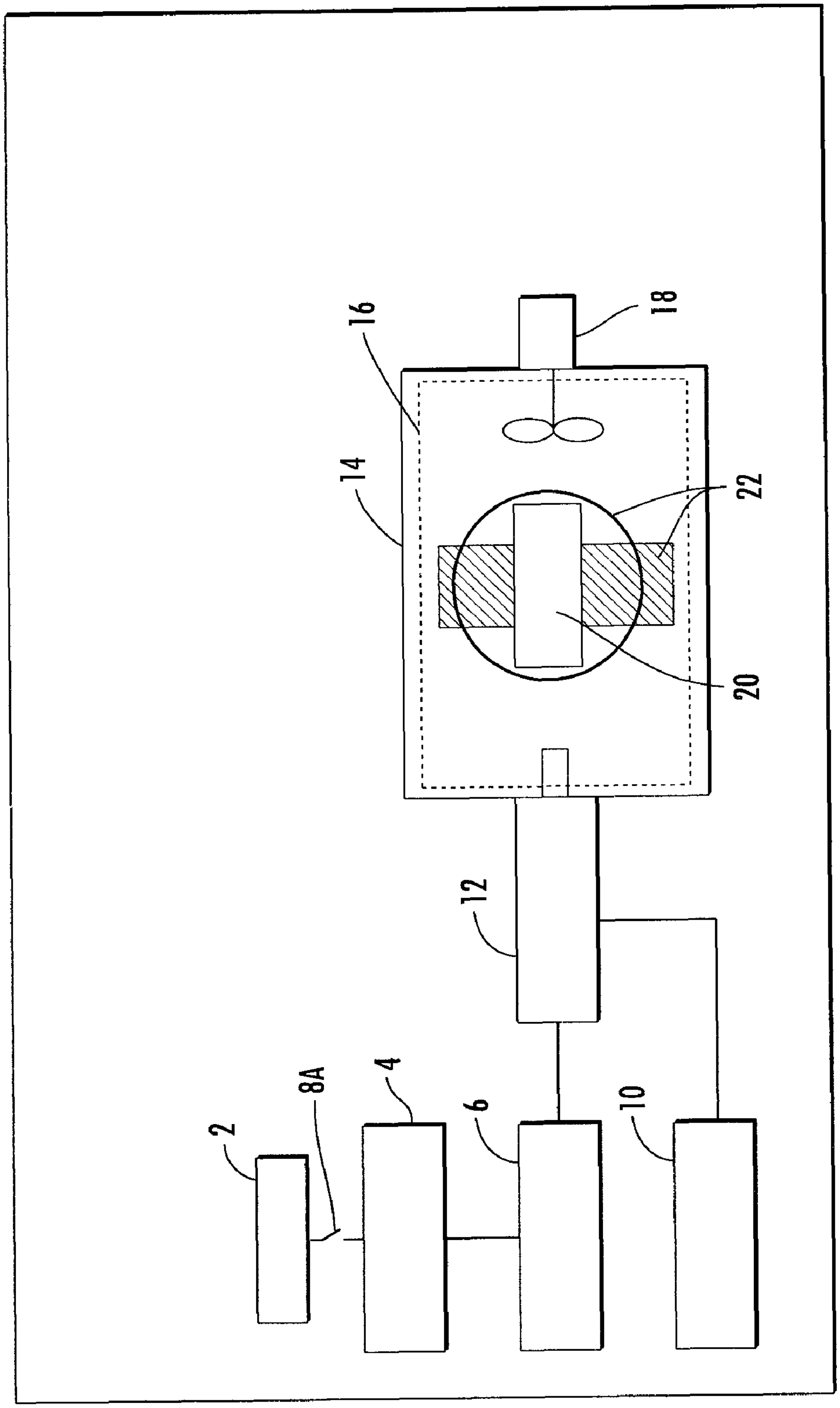
FIG. 1 is illustrates a first embodiment of the instant invention.
Figure 2:
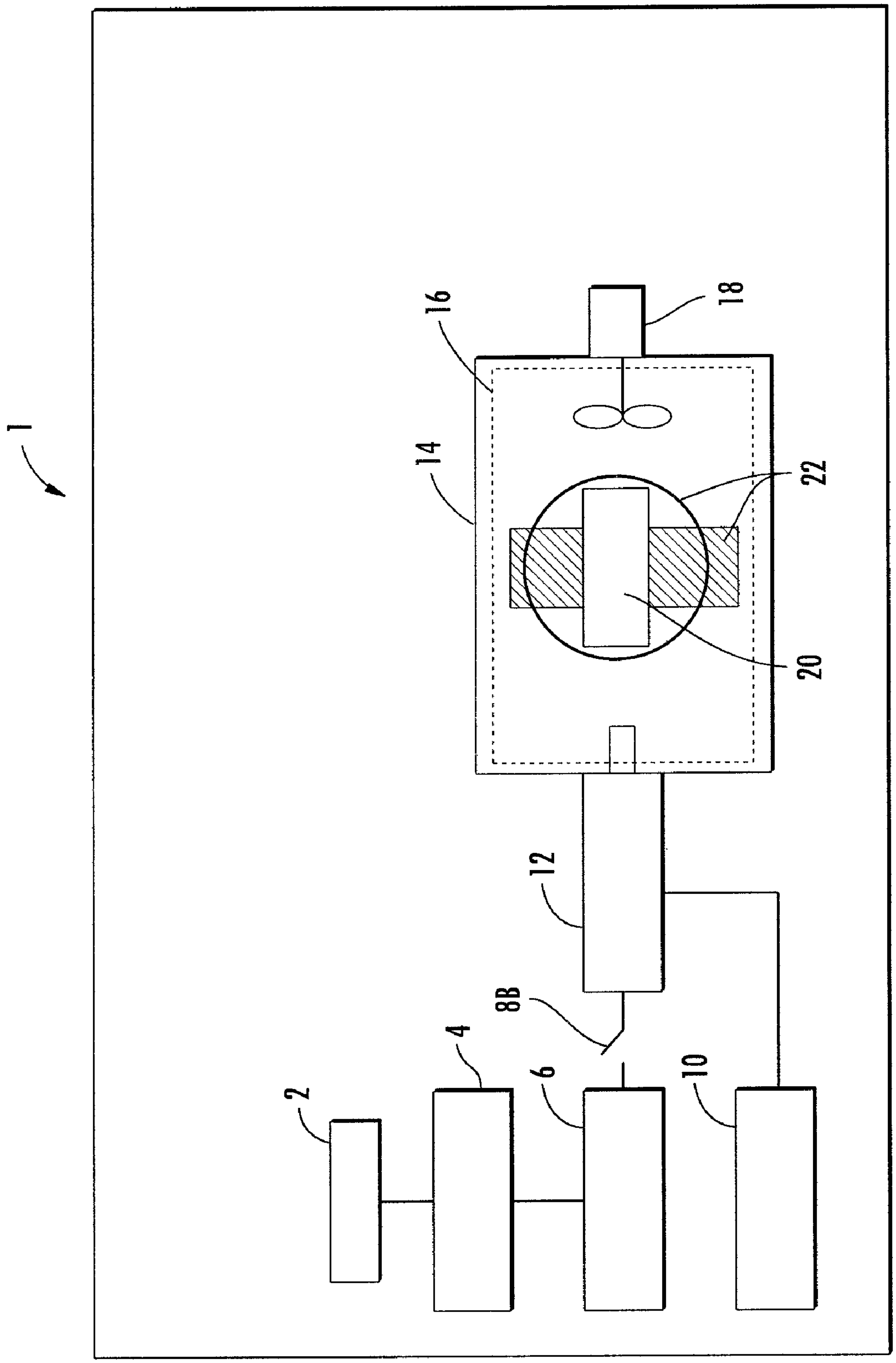
FIG. 2 is a second embodiment of the instant invention.

FIG. 1 is an illustration depicting the apparatus 1 for decommissioning the electronic storage device. As shown in FIG. 1 the apparatus 1 includes an AC power supply 2 that is electrically connected to a high voltage power supply 4. The high voltage power supply 4 provides pulsed high voltage DC power to the magnetron 12. The high voltage power supply requirements are variable thereby allowing the supply to be designed with architecture that best suits the application requirements. Magnetrons can be used to generate radio waves ranging from several hundred kilohertz to greater than twenty gigahertz. High voltage supply architectures can include a step-up transformer and diode, switching DC-DC converter and other known types of high voltage architectures. To reduce the peak power requirements of the high voltage supply, power can be stored in a high voltage capacitor bank 6. As shown in FIG. 1 a pulsed power switch 8A electrically connects the output of AC power supply 2 with the input of high voltage power supply 4. In the preferred embodiment of FIG. 2 the pulsed power switch 8A is removed and the pulse power switch 8B electrically connects the output of the capacitor bank 6 with the input of the magnetron 12.

The data storage elements on the electronic storage device are destroyed by the energy induced from the incident radio frequency energy. Thus, the higher the radio frequency energy, the higher the likelihood of complete data destruction. To run the magnetron at its peak power while preserving the operating life of the magnetron, the magnetron is pulsed on only for the time needed to assure data destruction. Thus pulse time is determined by the response time of the magnetron, the thermal characteristics of the magnetron, and the nature of the data storage device. To further preserve the life of the magnetron the high voltage to the magnetron can be ramped to its peak value using a DC-DC converter or similar device, thus reducing the cathode inrush current.

The magnetron 12 is physically mounted on a receptacle that includes an echoic cavity 14. The receptacle includes an access panel, such as a pivoting door, to provide access to the cavity thereby facilitating insertion and removal of the device 20 into and from the cavity 14. The microwave echoic cavity is a reflective cavity that efficiently reflects the microwave energy back towards a target 20. The cavity can be designed in such a way as to focus the microwave energy on the target 20. The magnetron 12 generates high power non-coherent microwaves that are used to open linking traces between cells and causes the disruption of the individual cell gate oxide of the data cells and controller cells that are present in nearly all forms of flash memory type electronic storage devices. The magnetron power transmission antenna can be placed directly in the cavity or coupled to the cavity using a waveguide.

Figure 3:
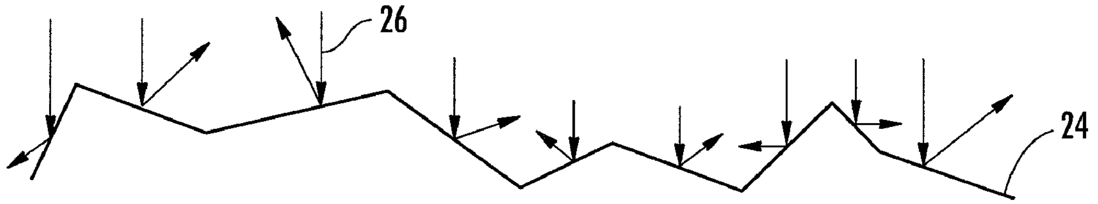
FIG. 3 illustrates the scattering structure on the lining of the cavity.

The echoic cavity 14 may also include a diffusive lining 16 that scatters the microwave field in such a way as to minimize the variations of microwave field intensity within the cavity. FIG. 3 shows one such scattering structure 24 that diffuses the incident waves 26. The angles and sizes of the reflective faces are randomized, thereby reducing standing wave patterns in the cavity. Alternatively, the scattering capability can be integrated into the cavity as part of the cavity wall structure itself. The presence of a uniform intensity field assures that the target 20 will experience the full strength of the field and not be able to hide in a field null.

The cavity 14 may also include a microwave field mixer 18 that varies the reflective surfaces of the cavity thereby varying the location if the microwave field maximum and minimum locations. The mixer 18 will ensure that the target device 20 will be exposed to a high power field and will not be able to hide in a null field. Likewise, the cavity may include a target transporter 22 that will move target 20 through the cavity 14 thereby reducing the possibility that the target can hide in a field null. The transporter 22 may take the form of a rotating turntable or any other suitable device.

All patents and publications mentioned in this specification are indicative of the levels of those skilled in the art to which the invention pertains. All patents and publications are herein incorporated by reference to the same extent as if each individual publication was specifically and individually indicated to be incorporated by reference.

It is to be understood that while a certain form of the invention is illustrated, it is not to be limited to the specific form or arrangement herein described and shown. It will be apparent to those skilled in the art that various changes may be made without departing from the scope of the invention and the invention is not to be considered limited to what is shown and described in the specification and any drawings/figures included herein.

One skilled in the art will readily appreciate that the present invention is well adapted to carry out the objectives and obtain the ends and advantages mentioned, as well as those inherent therein. The embodiments, methods, procedures and techniques described herein are presently representative of the preferred embodiments, are intended to be exemplary and are not intended as limitations on the scope. Changes therein and other uses will occur to those skilled in the art which are encompassed within the spirit of the invention and are defined by the scope of the appended claims. Although the invention has been described in connection with specific preferred embodiments, it should be understood that the invention as claimed should not be unduly limited to such specific embodiments. Indeed, various modifications of the described modes for carrying out the invention which are obvious to those skilled in the art are intended to be within the scope of the following claims.

What is claimed is:

1. An apparatus for permanently destroying data on an electronic memory device, the apparatus comprising:

an AC power supply connected to a high voltage power supply;

a bank of capacitors having an input electrically connected to said high voltage power supply and an output electrically connected to a magnetron;

a pulsed power switch enabling flow of electricity to said magnetron, whereby the magnetron is pulsed for the time needed to assure data destruction on said electronic memory device;

said magnetron mounted on a receptacle, said receptacle having an accessible cavity; said magnetron having a microwave energy output directed into said cavity and to said electronic memory device positioned within said cavity.

2. The apparatus of claim 1, wherein said cavity is an echoic cavity that will reflect the microwave energy and focus the microwave energy on the electronic memory device.

3. The apparatus of claim 2, wherein said cavity includes a lining that will diffuse and scatter the microwave energy.

4. The apparatus of claim 3, wherein the electronic memory device is positioned on a transporter to move said electronic memory device while being exposed to said microwave energy.

5. The apparatus of claim 4, wherein said cavity includes a microwave field mixer.

6. The apparatus of claim 5, wherein said magnetron includes a cathode heater.

7. The apparatus of claim 1, wherein said pulsed power switch is electrically connected between the outlet of the AC power source and the input of the high voltage power supply.

8. The apparatus of claim 1, wherein said pulsed power switch in electrically connected between the outlet of the bank of capacitors and the input of said magnetron.

9. The apparatus of claim 1, wherein when power is applied to the cathode, the cathode voltage is gradually increased over time at a rate which keeps the cathode inrush current below a predetermined level.

10. A method for permanently destroying data on an electronic memory device, the method comprising:

energizing an AC power source and conveying the output of said AC power source to the input of a high voltage power supply;

conveying the output of said high voltage power supply into an input of a bank of capacitors and conveying the output of said bank of capacitors into an input of a magnetron thereby generating microwave energy;

pulsing the power to said magnetron to assure destruction of data on said electronic memory device, directing said microwave energy at said electronic memory device positioned within a cavity located within a receptacle.

11. The method of claim 10 wherein the microwave energy is focused towards said electronic memory device, the cavity being an echoic cavity that reflects the microwave energy towards said electronic memory device.

12. The method of claim 11 including the step of diffusing and scattering the microwave energy within said cavity by providing the appropriate lining within said cavity, thereby creating a uniform field intensity and exposing the full strength of the microwave energy on said electronic memory device.

13. The method of claim 12 including the step of positioning said electronic memory device on a transporter located within said cavity whereby said electronic will not be able to hide in a field null but will be completely exposed to the microwave energy.

14. The method of claim 13 including the step of mixing the microwave energy within said cavity by energizing a mixer.

15. The method of claim 14 including the step of heating a cathode within said magnetron.

16. The method of claim 15 including the step of pulsing the power that is conveyed between said AC power source and high voltage power supply.

17. The method of claim 15 including the step of pulsing the power that is conveyed between the output of said high voltage power supply into the input of said bank of capacitors.

* * * * *